United States Patent [19]
Schuermeyer

[11] 4,438,351
[45] * Mar. 20, 1984

[54] GALLIUM ARSENIDE MIS INTEGRATED CIRCUITS

[76] Inventor: Fritz L. Schuermeyer, 1759 Southview Dr., Yellow Springs, Ohio 45387

[*] Notice: The portion of the term of this patent subsequent to Mar. 1, 2000 has been disclaimed.

[21] Appl. No.: 271,754

[22] Filed: Jun. 9, 1981

[51] Int. Cl.³ .................. H03K 17/687; H03K 3/356; H03K 19/00
[52] U.S. Cl. .................. 307/450; 307/279; 307/291; 307/304; 357/23
[58] Field of Search .............. 307/279, 450, 468, 304, 307/238.3, 238.5, 238.8, 291; 357/23 NS, 23 VT, 230 I

[56] References Cited
U.S. PATENT DOCUMENTS 3,996,656 12/1976 Cook, Jr. ..................... 357/23 I X
4,119,993 10/1978 Hartnagel et al. .............. 357/23 NS
4,252,580 2/1981 Messick ....................... 357/23 NS X
4,291,327 9/1981 Tsang ......................... 357/23 NS X
4,375,677 3/1983 Schuermeyer ................. 307/279 X

OTHER PUBLICATIONS

Yokoyama et al., "Low-Power, High-Speed Integrated Logic with GaAs MOSFET", 11th Conf., (1979 International) on Solid State Devices, Tokyo, 1979.
Kawakami et al., "Fabrication and Performance of InP. MISFET", Conf., International Electron Devices Meeting, Washington, D.C. Dec. 8-10, 1980.

Primary Examiner—Larry N. Anagnos
Assistant Examiner—David R. Hudspeth
Attorney, Agent, or Firm—Donald J. Singer; Bernard E. Franz

[57] ABSTRACT

A technique to utilize GaAs insulated gate field effect transistors (IGFETs) with large surface state densities in digital integrated circuits including latches is described. In this technique, the threshold voltage is electrically set to obtain enhancement mode characteristics of the IGFETs. Due to changes in surface charge with time, these circuits will not function at very low frequencies, but are very useful at gigahertz frequencies.

5 Claims, 11 Drawing Figures

GALLIUM ARSENIDE MIS INTEGRATED CIRCUITS

RIGHTS OF THE GOVERNMENT

The invention described herein may be manufactured and used by or for the Government of the United States for all governmental purposes without the payment of any royalty.

BACKGROUND OF THE INVENTION

This invention relates to GaAs Metal Insulator Semiconductor (MIS) integrated circuits, or Insulated Gate Field-Effect Transistor (IGFET) devices, and more particularly, to such devices of the buried channel type.

The following references show the state of the art:
1. L. Messick, "Power gain and noise of InP and GaAs insulated gate microwave FETs," Solid-State Electronics 22, pp 71–76, 1979.
2. R. L. VanTuyl, C. A. Liechti, R. E. Lee, and E. Gowen, "GaAs MESFET logic with 4 GHz clock rate" IEEE J. Solid State Circuits, Vol SC-12, pp 485–496, October 1977.
3. R. C. Eden, B. M. Welch, and R. Zucca, "Low power GaAs Digital ICs using Schottky diode-FET logic," 1978 Solid State Circuits Digest Tech Papers, February 1978, pp 68–69.
4. P. T. Greiling, C. F. Krumm, F. S. Ozdemir, L. H. Hackett, and R. F. Lohr Jr., "Electron beam fabricated GaAs FET inverter," IEEE Trans. Electron Devices, Vol ED-25, p 1340, November 1978.
5. R. E. Lundgren, C. G. Krumm, and R. L. Pierson, "Fast enhancement-mode GaAs MESFET logic," IEEE Trans. Electron Devices ED-26, p 1827, November 1979.
6. R. Zuleeg, J. K. Notthoff, and K. Lehovec, "Femtojoule high-speed planar GaAs E-JFET logic," IEEE Trans. Electron Devices, Vol ED-25, pp 628–639, June 1978.
7. W. E. Spicer, P. W. Chye, P. R. Skeath, C. Y. Su, and I. Lindau, "New and unified model for Schottky barrier and III-V insulator interface states formation," J. Vac. Sci. Techn. 16(5) pp 1422–1433, September/October 1979.
8. T. Mimura, N. Yokoyama, H. Kusakawa, K. Suvama, and M. Fukuta, "GaAs MOSFET for low power high-speed logic applications," IEEE Trans, Electron Devices, Vol ED-26, 1828, November 1979 and N. Yokoyama, T. Mimura, K. Suyama, H. Kusakawa, and M. Fukuta," GaAs MOSFET high-speed logic," 3rd International Conference on Solid State Devices, 1979, Tokyo, Japan.
9. R. L. VanTuyl and C. A. Liechti, "High speed GaAs MSI," 1976 ISSCC, Digest of Technical Papers, pp 20–21, February 1976.
10. J. Tihanyi and V. Hoepfner, U.S. Pat. No. 4,101,922 for a Field Effect Transistor with a Short Channel Length.
11. D. H. Lee, U.S. Pat. No. 4,156,879 for a Passivated V-Gate GaAs Field-Effect Transistor.
12. S. Akai and Y. Niskida, U.S. Pat. No. 4,158,851 for a Semi-Insulating Gallium Arsenide Single Crystal.
13. J. Tihanyi and G. Bell, U.S. Pat. No. 4,190,850 for a MIS Field Effect Transistor Having a Short Channel Length.

In the past, metal insulator semiconductor (MIS) GaAs devices have been studied, for example, by Messick et al. (1), in the hope of obtaining enhancement mode transistors which could be used in integrated circuits. At present, most digital GaAs circuits utilize depletion mode transistors which are cumbersome to use, require a relatively large area, and consume a large amount of power due to the required level shift circuit. For example, see VanTuyl et al. (2), Eden et al. (3) and Greiling et al. (4). Work is also performed on enhancement mode devices. For example, see Lundgren et al. (5) and Suleeg et al. (6). In these devices, carrier density in the active layer and its thickness is minimized to obtain enhancement mode characteristics. While the gates using enhancement mode devices indeed require less area and consume less power than gates with depletion mode devices, the current drive capability of the enhancement mode devices is reduced, resulting in slower gates.

Most work on MIS GaAs devices, for example, by Messick et al. (1), and by Spicer et al. (7), show large surface state densities which render these devices unstable, e.g., these transistors show hysteresis effects. In fact, no dc field effect transistor (FET) characteristics could be observed in GaAs IGFETS, where native oxides and SiON were used as insulators. Recently, T. Mimura et al. (8) was able to demonstrate ring oscillators using GaAs IGFETS, where the insulator was formed by plasma anodization. However, no work has been reported on using these devices in latches. Due to the hysteresis effects, latches are more difficult to realize than ring oscillators and yet latches are vital elements in today's integrated circuits, e.g., for prescaler applications.

SUMMARY OF THE INVENTION

The object of the invention is to provide integrated circuits having ultrahigh speed along with small dimension and low power.

According to the invention, integrated circuits are formed using GaAs MISFET devices of the buried channel type is which the insulated gate provides a capacitive effect. A dynamic technique is used to set the threshold voltage to a desired level. Specific embodiments include inverters and latches.

BRIEF DESCRIPTION OF THE DRAWING

FIG. 3b is a timing diagram of a string of inverters of FIG. 3a.

DETAILED DESCRIPTION

It has been observed that large interface state densities are encountered in GaAs-Insulator structures. See, for example, W. E. Spicer, P. Pianetta, I. Lindau and P.

W. Chye; Surface and Interface States on GaAs (110): Effects on Atomic and Electronic Rearrangement, J. Vac Sci Tech, 15 (1) pages 885–893, 1977. Due to these large interface state densities, only "unstable" MIS GaAs transistors have been fabricated. Due to the "unstable" behavior of these transistors, no functional digital integrated circuits were built with them. (Although T. Mimura et al. (8) demonstrated a ring oscillator with GaAs MOSFETS, none of the principles and circuit techniques described herein were used. No flip-flop circuits have been demonstrated by them). My disclosure herein teaches a novel circuit technique to allow the use of these "unstable" GaAs IGFETS in digital integrated circuits, including latches. In this technique, the hysteresis effects will be exploited to set the threshold voltage to the desired level; consequently these devices will be called electrically setable (ES) IGFETS. All GaAs MIS devices discussed in this paper are of the buried channel type rather than of the surface inversion type. Furthermore, due to the hysteresis effects, these devices will not function at dc level but will exhibit a low cutoff frequency. This cutoff frequency is typically in the kilohertz or below region and will be of non concern for most applications. For instance, a lower frequency cutoff limit in the kilohertz region will be of no consequence for prescalers, operating in the gigahertz region.

Electrically Setable GaAs IGFET

Figure 1A:
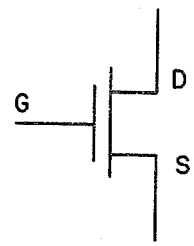
FIG. 1a is a symbol for a MISFET.

The IGFETS considered here are similar to depletion type metal semiconductor FETS (MESFETs) with the exception of an insulator between the gate and the semiconductor. It has been shown that the Fermilevel of these metal-insulator GaAs structures is pinned to a level of approximately 0.65 eV from the conduction band due to the existence of a large interface state density (7). The high surface state density acts in such a manner as to allow the interface to be considered metallic. This pinning level is very similar to the barrier height of Metal-GaAs Schottky barriers. Due to the large surface state density and the similarity of surface pinning level and barrier height, the IGFET as shown in FIG. 1a can be simulated by a capacitively coupled MESFET, as shown in FIB. 1b. It must be pointed out that this model is not valid for the Si-SiO$_2$ case due to the lack of sufficient interface states.

Figure 6:
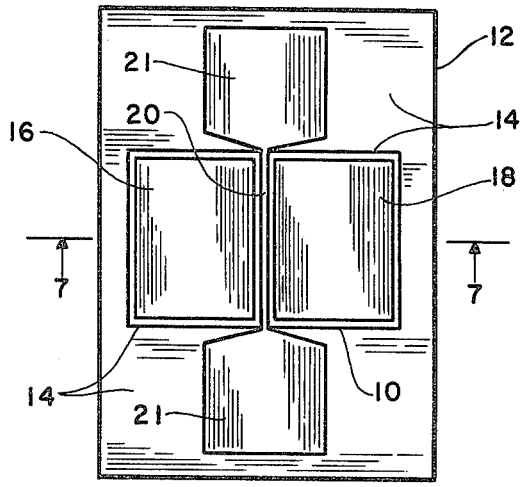
FIGS. 6 and 7 are top and cross section views, respectively, of a typical IGFET device.
Figure 7:
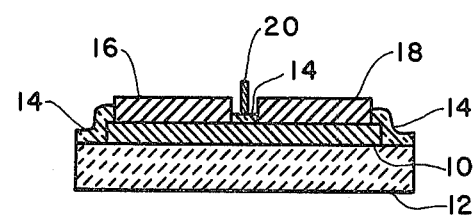

FIGS. 6 and 7 are top and cross-section views of one typical IGFET, which may be fabricated using well known techniques. Starting materials were epitaxial grown or ion implanted active layers 10 with a typical doping concentration of $6 \times 10^{16}$ cm$^{-3}$ and a thickness of approximately 200 nm., on a substrate 12. Mesas were etched into the epitaxial layers 12, and a silicon nitride insulating layer 14 was deposited by a plasma enhanced deposition (PED) process. Next the aluminum gates 20 with gate pads 21 were deposited and defined either by lift off or by etching. Windows for the source 16 and the drain 18 were opened into the Si$_3$N$_4$ insulator 14 by plasma etching. Au-Ge-Ni was deposited and the contacts were annealed at 400° C. for 2 minutes and at 425° C. for another 2 minutes. A second metallization (not shown) was provided using PED Si$_3$N$_4$ and Al. The Si$_3$N$_4$ layers were typically 1000 Å thick.

Figure 1B:
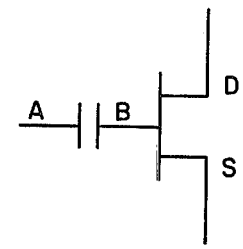
FIG. 1b is a capacitor-MESFET equivalent circuit for the GaAs device of FIG. 1.

The knowledge of the MISFET model as shown in FIB. 1b allows the use of these MISFET devices in circuit types as described in my pending patent applications for "Dynamic MESFET Logic With Voltage Level Shift Circuit," Ser. No. 261,358 filed May 7, 1981; and for a "Dynamic Random Access Memory Cell using Field Effect Devices," Ser. No. 265,522 filed May 20, 1981, now U.S. Pat. No. 4,375,677 issued Mar. 1, 1983. Both patent applications are based on capacitively coupled MESFETs, similar to the circuit in FIG. 1b. Consequently, the capacitor-MESFET structure can be replaced by a MISFET. The thrust of the model in FIG. 1b is that this structure shows enhancement mode characteristics and hence is a desirable structure for integrated circuits. The reason for the enhancement mode behavior can be explained as follows: Assume a positive potential step is applied to node A of the circuit in FIG. 1b. This will cause node B to move also to positive value. However, the input structure of the MESFET is a forward biased Schottky barrier diode, limiting the positive voltage on node B to approximately 0.5 volts. This voltage on node B causes the transistor to be conductive. When the potential on node A is returned to zero volts, the change in potential is capacitively coupled to node B, causing it to assume a negative potential. The negative potential on node B causes the transistor current $I_D$ to decrease or the transistor to be turned off. Hence, a high potential on node A causes the transistor to be conducting and a low potential (less positive potential) causes the transistor to be insulating. Obviously, this structure is immune to the dc level at node A and responds only to the ac input signal. A further conclusion from the above argumentation is that if the potential between gate and source remains always zero, the transistor acts as a depletion mode device. Obviously, the charge on node B leaks off with time, returning, e.g., the enhancement mode device into a depletion mode device. This change of characteristics is intolerable for many applications. Hence, for proper operation of such a circuit, the device must be pulsed with a repetition time shorter than the leakage time constant.

Figure 8:
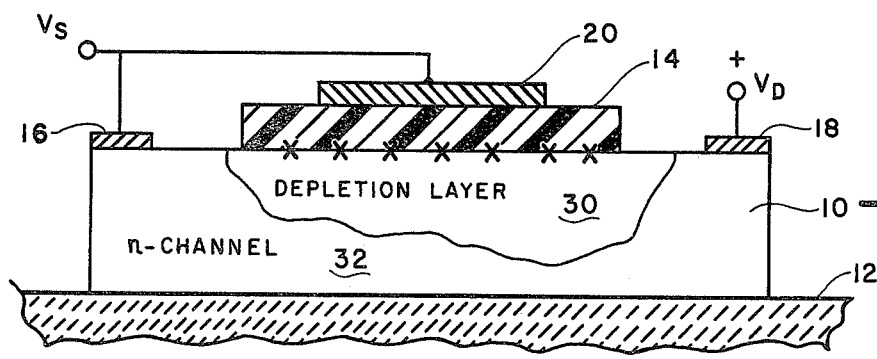
FIGS. 8 and 9 are symbolic diagrams of a device cross section illustrating the interface states and the buried channel.
Figure 9:
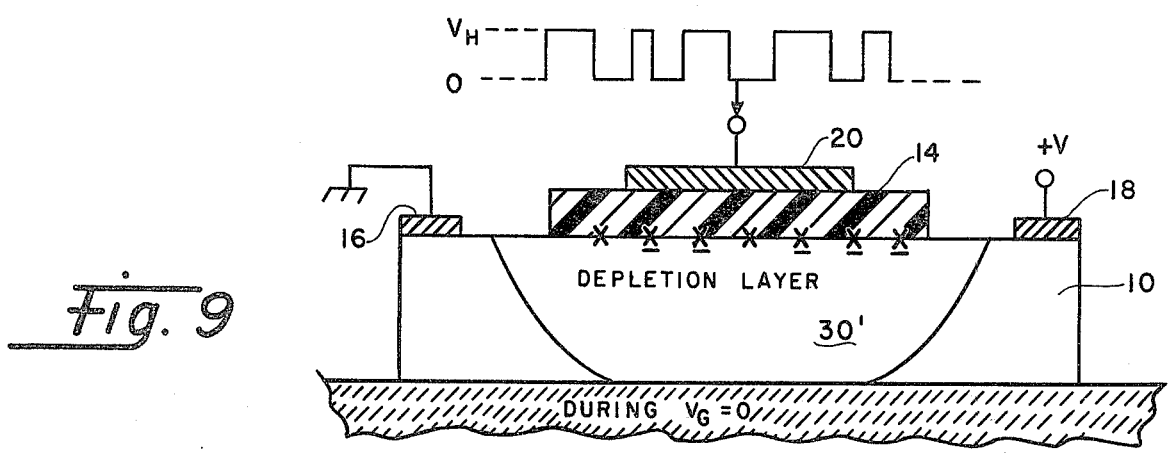

FIGS. 8 and 9 are symbolic diagrams of a device cross section illustrating the interface states and the buried channel. The interface states X (or surface states) are present at the interface of the insulator 14 and the active layer 10 of the semiconductor. They are defined as energy levels within the forbidden gap which can exchange charges with the semiconductor. The interface states are only one type of the many states and charges that exist in a practical MIS device, which will in one way or another, affect the MIS characteristic, others being fixed surface charges which are located near or at the semiconductor surface and are immobile under applied electric fields, mobile ions within the insulator, and ionized traps which can be created, for example, by X-ray radiation.

FIG. 8 shows the situation with the source 16 and gate 20 connected together, and a potential $V_D$ applied to the drain 18, as when an IGFET is used as a load device. There are some negative charges at the interface states X, and a depletion layer 30 forms within the active layer 10. A channel 32 exists in the active layer 10 between the source 16 and the drain 18 under the depletion layer 30, and is designated in the art as a buried channel.

FIG. 9 shows the situation with the source 16 grounded and a positive potential appearing on the drain. When a high signal potential $V_H$ is applied at the gate 20, the potential at the interface is unable to follow due to charging of interface states X and current flows to the source 16. Then when the potential at gate 20 returns to zero, the interface states X are charged to a negative potential. This causes the depletion layer 30' to extend all the way down through the active layer 10, which pinches off the channel between the source 16 and the drain 18. Next when the signal potential at the gate 20 goes high, the potential across the dielectric of the insulator 14 causes the interface to assure a potential such that the depletion layer 30 is then similar to that shown in FIG. 8, providing a channel between the source 16 and the drain 18.

IGFET Integrated Circuit

Figure 2:
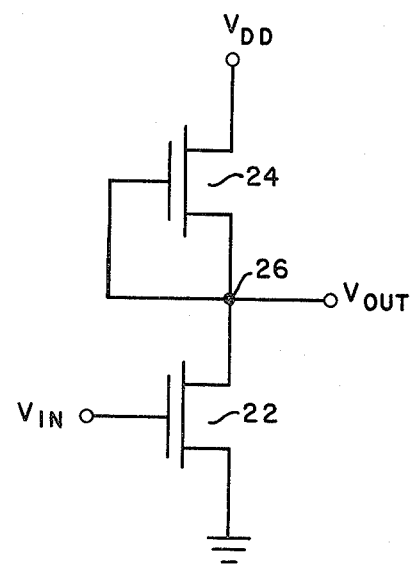
FIG. 2 is a schematic diagram of a MISFET inverter circuit.
Figure 3A:
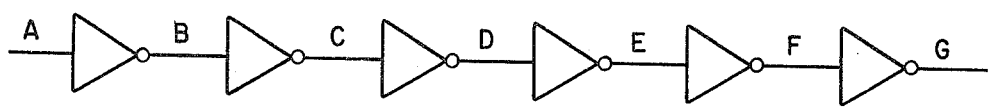
FIG. 3a is a functional block diagram of a string of inverters.
Figure 3B:
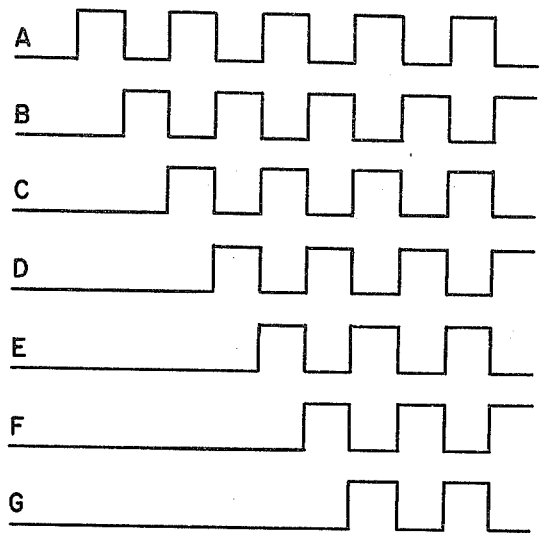

FIG. 2 shows the preferred basic inverter structure. It comprises two GaS MISFET devices, an active transistor 22 and a load transistor 24. The node 26 is the junction of the drain of transistor 24 and the source of transistor 22. Applying positive pulses to $V_{in}$ at the gate of transistor 22 causes it to act as an enhancement mode device. Since the gate of the load element of transistor 24 is connected to its source, this transistor acts as a depletion mode device. This is an example where the same device structure can either act as an enhancement or depletion mode device. The gate width of the transistor 24 is shorter than that of transistor 22 by typically 30% to 50%. Hence, when $V_{in}$ is at the high level (typically +3 volts), $V_{out}$ will be low, close to zero potential and when $V_{in}$ is low (typically zero volts), $V_{out}$ will be high, typically 3 volts. In a string of inverters, (FIG. 3) the initiation signal needs to propagate. In a string of n inverters, a total of (n1)/2 input pulses are required to put all active devices into enhancement mode (FIG. 3b) by applying a positive pulse to each input gate of the inverters. After this activation, input pulses with repetition times shorter than the leakage time constant are required to keep the active devices of these inverters in enhancement mode.

Figure 4:
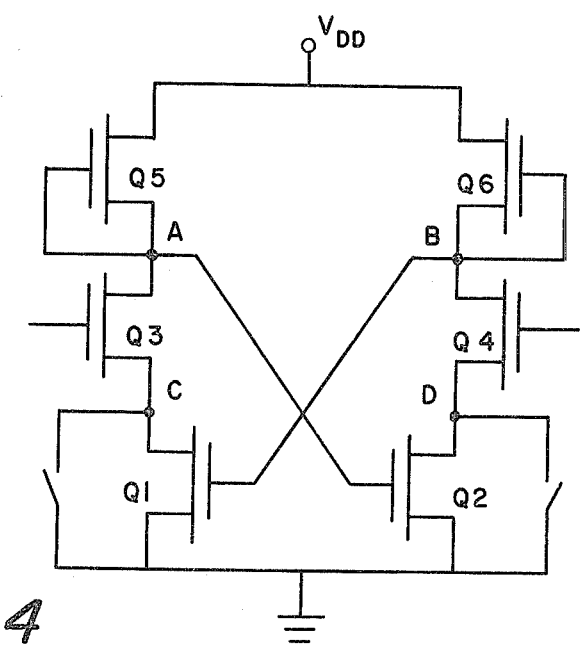
FIG. 4 is a schematic diagram of a flip-flop circuit utilizing GaAs MISFETS.

Flip-flops are important parts of integrarted circuits; they are used in latches, divider circuits, memory cells and others. FIG. 4 represents the preferred flip-flop structure. Here transistors Q1 and Q2 are the active transistors, transistors Q3 and Q4 are required for initiation of the circuit, and transistors Q5 and Q6 are load devices. The operation of this cell can be explained as follows: Assume nodes A, B, C and D to be low and the flip-flop to be inactive. To activate this circuit, a negative pulse going from high level to low is applied to the gates of transistors Q3 and Q4 causing nodes A and B to assume a potential close to $V_{DD}$, thereby activating transistors Q1 and Q2. When the inputs of transistors Q3 and Q4 are returned to the high level, the cell goes into its active mode, e.g., nodes A and C are at high potential and nodes B and D at low potential. The logic state of the circuit can be switched by applying a low potential to node C (in the above case) for a short time, causing node A to go low and thereby turning off transistor Q2, causing nodes B and D to go high, and thereby turning off transistor Q1 and forcing nodes A and C to remain low. This flip-flop circuit remains activated as long as the logic state is flipped back and forth with a repetition time, shorter than the leakage time constant.

Figure 5:
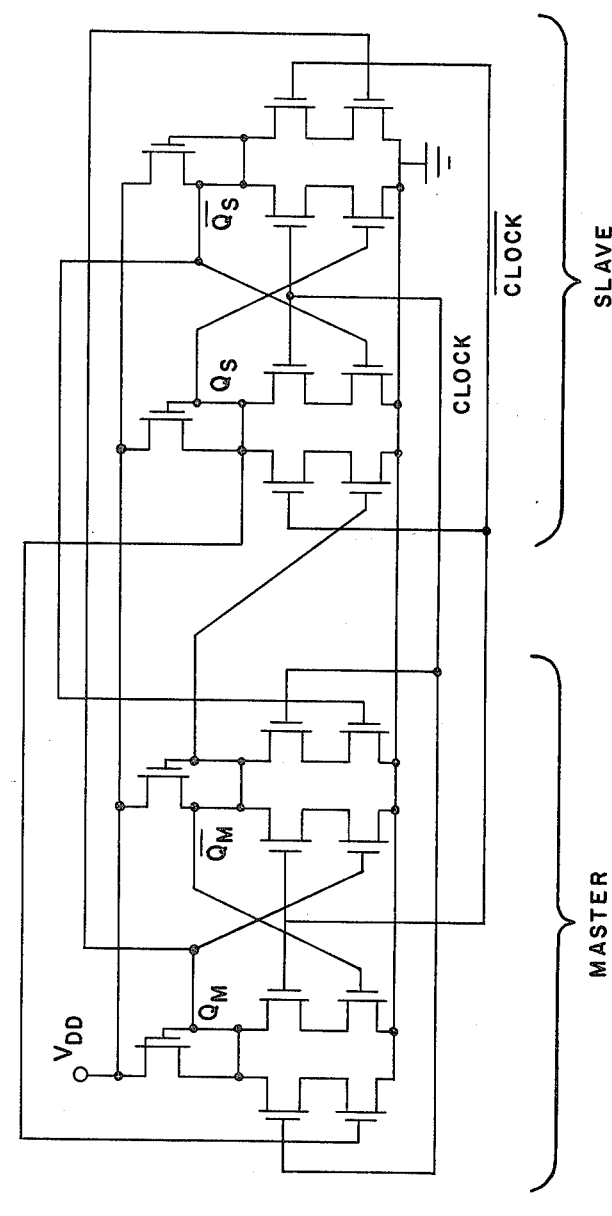
FIG. 5 is a schematic diagram of a divide-by-two circuit utilizing GaAs MISFETS.

One example of a flip-flop application is in a divider circuit. FIG. 5 shows a schematic diagram of the preferred divide-by-two cells. This cell consists of cross coupled Master-Slave flip-flop circuits. The input signals required are clock and $\overline{\text{clock}}$ and the outputs are $Q_s$ and $\overline{Q_s}$. Again, the cicuit needs to be activated. For example, we assume that the clock signals have positive potential. To start up this divide circuit, $V_{DD}$ is applied. The transistors, connected to clock and $\overline{\text{clock}}$ can be activated by simply running the clocks. After these transistors have been activated, the remaining transistors can be activated by, e.g., holding both clocklines at ground potential for a short time. This procedure will cause all active branches to be turned off and $Q_m$, $Q_m$, $\overline{Q_s}$ to go high, causing the activation of the remaining transistors. When the clock resumes, the circuit will perform the divide-by-two function. The clock frequency has to be high enough to avoid problems with the leakage time constant.

Implementation of NAND and NOR gates are similar to that in GaAs MESFET technology with the omission of the level shifters. Also, similar to MESFET technology, double gate transistors are possible. The above presentation gives typical examples to teach the implementation of integrated circuits using "unstable" GaAs MISFETs. Several methods for making these "unstable" GaAs MISFETs exist (see reference 1) and no new technology development is required.

The subject matter disclosed herein is also described in my paper "GaAs IGFET Digital Integrated Circuits: IEEE Transactions of Electronic Devices." Vol. ED-28, No. 5, pages 541–545, May 1981, hereby incorporated by reference. Also see Schuermeyer et al., "GaAs IGFET: A new Device for High Speed Digital ICs" in IEDM Tech. Dig. (Washington, D.C. Dec. 8–10, 1980) paper 17.3.

GaAs MISFETS were fabricated using $Al_2O_3$, formed by anodization as an insulator. Inverters and flip-flops were demonstrated. Transfer characteristics were determined and the lower toggle frequency of the flip-flop was found to be less than 100 hertz.

Comparison Between the ES IGFET Technology and Other Enhancement Mode GaAs Technologies At present, work is being performed in three additional areas to achieve enhancement mode GaAs technologies. Fixed threshold voltage IGFETs (8), MESFETs (5) and JFETS (6). In Table 1, the advantages and disadvantages of these enhancement mode GaAs Technoligies are compared. Disadvantages of the ES IGFETs are their low frequency cutoff and the requirements for additional transistors to allow activation of the transistors. These disadvantages are considered of little concern since GaAs circuits will not be used in these low frequency ranges (kHz range) in most cases and since the additional transistors are required only in selected circuits. A further disadvantage is that ES IGFETs cannot be used as source followers. This again seems to be a minor disadvantage since a technology combining ES IGFETs with depletion mode MESFETs appears feasible and hence, MESFETs can be used for source follower applications.

The major advantage of the ES IGFET over other enhancement mode GaAs technologies is the ease of fabrication, especially with respect to threshold voltage. For instance, in the MESFET case, a very thin and lightly doped channel region is used, which is pinched off at zero gate potential, yet the maximum gate voltage is only 0.5 V; consequently, extremely good control over $V_T$ is required. In contrast, large signal voltages ($\approx 3$ V) can be utilized with ES IGFETs had hence larger variations in $V_T$ can be tolerated. Furthermore, channel implantations through the gate insulator appear feasible, which eliminate the need for channel etching and should provide better control of $V_T$. A further advantage of the ES IGFET is that their channels can be more highly doped, resulting in higher conductivity of the channel and higher speed performance. Advantages of IGFETs over MESFETs and JFETs are their ability to work with higher signal voltages, easing the interfacing with other circuits internal or external to the chip and also improving noise immunity. Finally, an important advantage of the ES IGFET technology is the fact that $Si_3N_4$ can be utilized as gate insulator. This insulator can also be utilized for capping and allowing high temperature treatment of these structures, e.g., for annealing of ion implantation. Hence, techniques utilized in silicon technology such as self-aligned gate technology appear feasible.

Conculsion

It has been shown that IG FETs with large surface state densities can be utilized in GaAs integrated circuits. These devices do not possess fixed threshold voltages but their threshold voltages can be electrically set. These structures are not able to operate from the high frequency cutoff point to dc level but possesses a cutoff at low frequencies. It has been demonstrated that activation is required before operation of the circuit can start. This activation is accomplished by applying a positive pulse to the gate of the IG FET. Some circuits such as latches require additional transistors for activation of the circuit. It is concluded that these IG FET circuits are competitive and probably outperform other embodiment mode GaAs circuits. A distinct advantage of the IG FET over other enhancement mode GaAs technologies is tolerance to processing variation.

Thus, while preferred constructional features of the invention are embodied in the structure illustrated herein, it is to be understood that changes and variations may be made by the skilled in the art without departing from the spirit and scope of my invention.

TABLE I

| ENHANCEMENT MODE GaAs TECHNOLOGIES | | | |
|---|---|---|---|
| ES IGFET | Fixed $V_T$ IGFET | MESFET | JFET |
| ADVANTAGES | | | |
| Noncritical Processing | Large Signals | Low Power Radiation Hardness | Low Power Radiation Hardness |
| Hibh Channel Conductance | Noise Immunity | | |
| Large Signals | Compatible with D-MESFETs | | |
| Noise Immunity | | | |
| High Temperature Processing | | | |
| Selfaligned Gate | | | |
| Compatible with D-MESFETs | | | |
| Radiation Hardness | | | |
| DISADVANTAGES | | | |
| Cutoff at Low Frequencies | $V_T$ Control Critical | $V_T$ Control Critical | $V_T$ Control Critical |
| Activation of Transistor | Low Channel Conductance | Low Channel Conductance | Low Channel Conductance |
| No Source Followers | Sensitive to Radiation | Small Signals | Small Signals |
| | | Low Noise Immunity | Low Noise Immunity |
| | | Not Compatible with D-MESFETs | Not Compatible with D-MESFETs |

I claim:

1. An integrated circuit using metal insulator semiconductor field effect transistors (MISFET) of the buried channel type in which the semiconductor comprises an active layer of gallium arsenide (GaAs), each transistor having a source, a drain, and at least one gate, with a gate insulator of a material which provides large interface trap states, the region of the active layer under the gate having a doping and being of sufficient thickness so that when there is a direct connection between the source and gate providing zero direct-current bias a depletion layer extends only partly through said region and the transistor is therefore conducting, said integrated circuit comprising:

at least one inverter circuit with load means and an active transistor in series across a direct current bias supply with a node between them, the drain and source of the active transistor being coupled to said node and to a terminal of said bias supply respectively, an input connection to the gate of the active transistor, means to electrically set a threshold voltage for bias at the gate of the active transistor via said interface trap states, and to maintain said threshold voltage by signals above a cutoff frequency at said input connection which may vary between a given high level substantially equal to the bias potential at said source such that an initial high-level signal charges said interface trap states and the internal between high-level signals is sufficiently short to maintain the charge.

2. An integrated circuit using metal insulator semiconductor field effect transistors (MISFET) of the buried channel type having large interface trap states in which the semiconductor is qallium arsenide (GaAs), each transistor having a source, a drain, and at least one gate, said integrated circuit comprising:

two inverter circuits, each inverter circuit having load means and an active transistor in series across a direct current bias supply with a node between them, the drain and source of the active transistor being coupled to said node and to a terminal of said bias supply respectively, an input connection to the gate of the active transistor, means to electrically set a threshold voltage for bias at the gate of the active transistor via said interface trap states, and to maintain said threshold voltage by signals above a cutoff frequency at said input connection which vary between a given high level substantially equal to the bias potential at said source such that an initial high-level signal charges said interface trap states and that interval between high-level signals is sufficiently short to maintain the charge:

wherein said inverter circuits are connected as two branches of a latch, with direct cross coupling from said node of each branch to the gate of the active transistor of the other branch.

3. An integrated circuit as set forth in claim 2, wherein each branch includes an initiation transistor, said coupling of the drain of the active transistor to said node being via the source-drain path of the initiation transistor, and wherein the circuit is activated by a negative pulse going from high level to low applied to the gates of both of the initiation transistors..

4. An integrated circuit as set forth in claim 1, 2 or 3, wherein said load means is load transistor having its source and gate connected to said anode, and its drain connected to another terminal of said bias supply.

5. The method of operating an integrated circuit using metal insulator semiconductor field effect transistors (MISFET) of the buried channel type in which the semiconductor comprises an active layer of gallium arsenide (GaAs), with a gate insulator of a material which provides large interface trap states, the region of the active layer under the gate having a doping and being of sufficient thickness so that when there is a direct connection between the source and gate providing zero direct-current bias a depletion layer extends only partly through said region and the transistor is therefore conducting, said integrated circuit comprising at least one inverter circuit with load means and an active transistor in series across a direct current bias supply, with a node between them, the drain and source of the active transistor being coupled to said node and to a terminal of said bias supply respectively, and an input connection to the gate of the active transistor, the method comprising:

applying signals at said connection to electrically set a threshold voltage for bias at the gate of the active transistor via said interface trap states, and to maintain said threshold voltage by signals above a cutoff frequency which vary between a given high level and a low level substantially equal to the bias potential at said source such that said interface trap states do not discharge.

* * * * *

UNITED STATES PATENT AND TRADEMARK OFFICE
CERTIFICATE OF CORRECTION

PATENT NO. : 4,438,351

DATED : March 20, 1984

INVENTOR(S) : Fritz L. Schuermeyer

It is certified that error appears in the above-identified patent and that said Letters Patent is hereby corrected as shown below:

Col. 3, line 24, change "non" to --no--.

Col. 5, line 6, change "assure" to -- assume --.

line 25, insert a space between "to" and "zero".

line 29, change "(nl)/2" to --(n+1)/2--.

line 65, correct the spelling of --circuit--.

Col 6, line 5 and 6, change "$Q_m$, $Q_m$, $\bar{Q}_s$" to --$Q_m$, $\bar{Q}_m$, $Q_s$, $\bar{Q}_s$--.

Col 7, line 28, change "embodiment to --enhancement--.

Signed and Sealed this

Fourteenth Day of August 1984

[SEAL]

Attest:

Attesting Officer

GERALD J. MOSSINGHOFF

Commissioner of Patents and Trademarks